United States Patent [19]
Cho et al.

[11] Patent Number: 5,447,885
[45] Date of Patent: Sep. 5, 1995

[54] ISOLATION METHOD OF SEMICONDUCTOR DEVICE

[75] Inventors: Hyun-jin Cho, Kyungki-do; Heung-mo Yang, Daegu; Yun-sung Shin, Kyungki-do; Oh-Hyun Kwon, Seoul, all of Rep. of Korea

[73] Assignee: Samsung Electronics Co., Ltd., Suwon, Rep. of Korea

[21] Appl. No.: 268,948

[22] Filed: Jun. 30, 1994

[30] Foreign Application Priority Data

Oct. 25, 1993 [KR] Rep. of Korea ............... 1993-22236

[51] Int. Cl.$^6$ ............................................. H01L 21/76
[52] U.S. Cl. ........................................ 437/70; 437/69; 437/241; 437/968
[58] Field of Search ............ 437/69, 70, 72, 73, 437/968

[56] References Cited

U.S. PATENT DOCUMENTS

| | | | |
|---|---|---|---|
| 4,016,007 | 4/1977 | Wada et al. | 437/69 |
| 4,407,696 | 10/1983 | Han et al. | 437/69 |
| 4,897,364 | 1/1990 | Nguyen et al. | 437/69 |
| 4,900,396 | 2/1990 | Hayashi et al. | 156/651 |
| 5,192,707 | 3/1993 | Hodges et al. | 437/69 |
| 5,236,862 | 8/1993 | Pfiester et al. | 437/73 |
| 5,260,229 | 11/1993 | Hodges et al. | 437/70 |
| 5,338,750 | 8/1994 | Tuan et al. | 437/70 |
| 5,358,893 | 10/1994 | Yang et al. | 437/69 |

FOREIGN PATENT DOCUMENTS 0090960  6/1982  Japan ............................ 437/968
0153429  9/1982  Japan .

*Primary Examiner*—Brian E. Hearn
*Assistant Examiner*—Trung Dang
*Attorney, Agent, or Firm*—Charles R. Donohoe; Robert A. Westerlund, Jr.; Stephen R. Whitt

[57] ABSTRACT

In a method for forming an isolation region in a semiconductor device, after forming a first oxide film and a silicon film on a semiconductor substrate, an oxidation-blocking film is formed on the silicon film. Then, a high-temperature heat treatment process is performed in a nitrogenous atmosphere. The oxidation-blocking film is selectively etched to form an opening, and a thermal oxidation process is performed to form a thermal oxide film in the opening. A bird's beak between the oxidation-blocking film and the silicon film is suppressed because of the heat treatment in a nitrogenous atmosphere, so that stable isolation characteristics can be secured.

8 Claims, 4 Drawing Sheets

ISOLATION METHOD OF SEMICONDUCTOR DEVICE

BACKGROUND OF THE INVENTION

The present invention relates to an isolation method of a semiconductor device and more particularly, to a selective oxidation method of a buffer polysilicon which is an improved method for local oxidation of silicon (LOCOS).

Generally speaking, as the integration of semiconductor devices increases, the size of an individual element formed on a semiconductor substrate becomes reduced and the size of an isolation region which electrically isolates that individual element also becomes gradually reduced to a sub-micron level.

In such a highly integrated semiconductor device, when an isolation region is formed using a conventional LOCOS method for forming a semi-recessed field oxide film, a large bird's beak occurs, so that device isolation is impossible in the fine pattern. To solve this problem, a selective polysilicon oxidation (SEPOX) method is proposed.

FIGS. 1 and 2 are cross-sectional views for illustrating a conventional SEPOX method.

Referring to FIG. 1, after forming a thin pad oxide film 2 on a semiconductor substrate 1 by a thermal oxidation process, a buffer polysilicon layer 3 and a silicon nitride film 4 are sequentially formed on pad oxide film 2. Then, a predetermined portion of silicon nitride film 4 is etched by a lithography process, thereby forming an opening (not shown) which defines an isolation region. Then, buffer polysilicon layer 3 and the surface portion of semiconductor substrate 1 which are exposed by the opening are selectively oxidized, thereby forming a field oxide film 5.

Referring to FIG. 2, silicon nitride 4 and buffer polysilicon layer 3 are removed, thereby completing the process for forming the isolation region.

According to the above-described SEPOX method, since oxidation stresses due to a volume expansion are imposed on buffer polysilicon layer 3 when field oxide film 5 is formed, the stress applied to substrate 1 and the resulting size of a bird's beak are reduced. However, also in such a SEPOX method, bird's beaks occur at two places when the size of the active region is reduced to sub-micron level and less. That is, a bird's beak occurs between pad oxide film 2 and semiconductor substrate 1 ("a" in FIG. 1 and hereinafter referred to as a bottom bird's beak), so that the size of the active region is reduced. Another bird's beak also occurs between silicon nitride film 4 and buffer polysilicon layer 3 ("b" in FIG. 1 and hereinafter referred to as a top bird's beak).

In the case of bottom bird's beak (a), the generation thereof is suppressed if the thickness of pad oxide film 2 is decreased and the thickness of buffer polysilicon layer 3 is increased. In the case of top bird's beak (b), the generation thereof cannot be suppressed even though the thicknesses of the above layers are increased. Also, if top bird's beak (b) occurs severely, as shown in FIG. 2, buffer polysilicon layer 3 is left between top bird's beaks (b) though silicon nitride film 4 and buffer polysilicon layer 3 are removed after field oxide film 5 is formed (refer to "P" in FIG. 2). Field oxide film 5, therefore, loses desirable properties of an isolation region.

For solving the problems of the SEPOX method as described above, a method where a remaining buffer polysilicon layer portion is oxidized after the field oxide film is formed is disclosed in U.S. Pat. No. 4,459,325. However, according to this method, the top bird's beak between the silicon nitride film and the buffer polysilicon layer still cannot be completely removed.

SUMMARY OF THE INVENTION

Therefore, it is an object of the present invention to provide an isolation method of a semiconductor device which can completely remove the generation of the top bird's beak in the SEPOX method.

Thus, a method is provided in which an oxide layer, a silicon layer, and an oxidation-blocking layer are formed on a semiconductor substrate.

According to the present invention, the interface between the silicon film and the oxidation-blocking film is stabilized by performing a heat treatment step after the oxidation-blocking film is formed. As a result, the generation of the top bird's beak is suppressed when the thermal oxide film defining an isolation region is formed.

According to a preferred embodiment of the present invention, the heat treatment is performed in a nitrogen atmosphere for about eight hours at a temperature of about 1150° C. A polysilicon or an amorphous silicon is used as the material constituting the silicon film.

The heat treatment in the nitrogen atmosphere may be performed after the opening is formed in the oxidation-blocking film.

For accelerating the bonding reaction between the silicon film and the oxidation-blocking film, a step of implanting nitrogen ions on the entire surface of the resultant structure may be included after the formation of the oxidation-blocking film.

A step of nitrifying a native oxide film which is generated on the silicon film, using a reaction with $NH_x$ gas at a temperature of 850° C. in a nitride film deposition chamber, may be included before the step of forming the oxidation-blocking film.

DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention will be explained in more detail with reference to the attached drawings.

Figure 3:
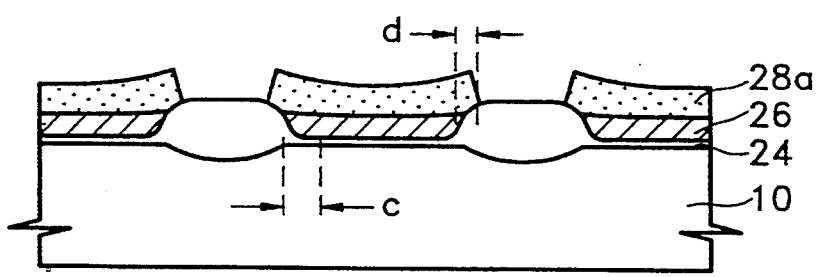
FIG. 3 is a cross-sectional view showing an isolation region which is manufactured according to the present invention.

FIG. 3 is a cross-sectional view showing an isolation region which is manufactured according to the present invention.

Figure 1:
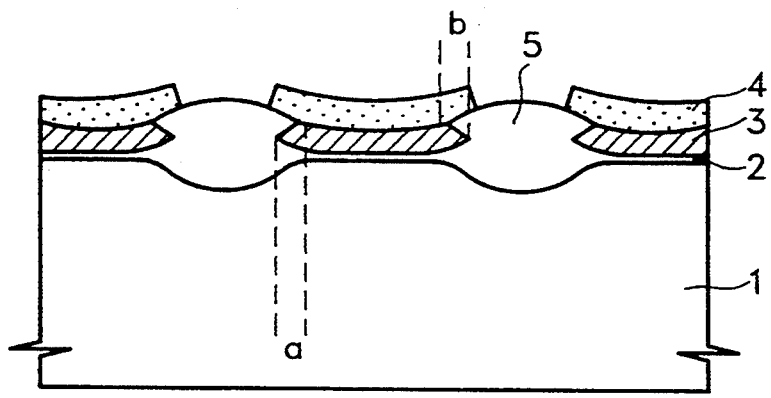
FIGS. 1 and 2 are cross-sectional views for illustrating a conventional SEPOX method.
Figure 2:
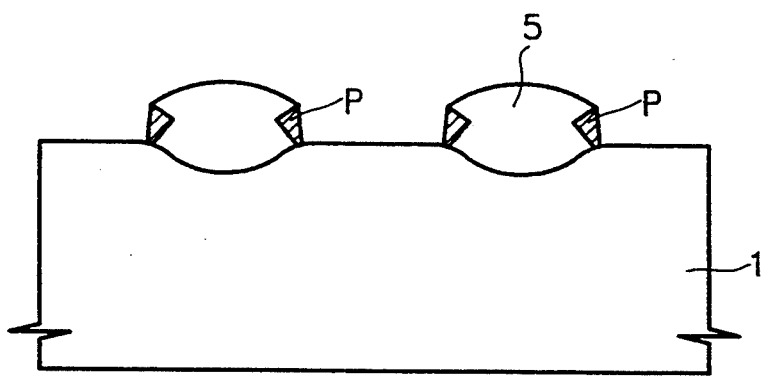

Upon comparison with the isolation region shown in FIG. 2, FIG. 3 shows that the size of a bottom bird's beak (c), existing between a first oxide film 24 and silicon film 26 formed on a semiconductor substrate 10, is reduced. Also, the generation of a top bird's (d) beak between silicon film 26 and a oxidation-blocking film 28 is greatly suppressed.

FIGS. 4 through 7 are cross-sectional views for illustrating an isolation method according to the present invention.

After forming a first oxide film 24 about 240Å thick on a semiconductor substrate 10 by a thermal oxidation process, silicon film 26, which serves as a buffered layer for alleviating stresses due to a volume expansion produced when a field oxide film is formed in a subsequent process, is formed on first oxide film 24. A material which has similar physical properties as those of the material constituting semiconductor substrate 10, (e.g., a polysilicon or an amorphous silicon), is used as a material constituting silicon film 26. Silicon film 26 is formed to a thickness of about 1,000Å by a low-pressure chemical vapor deposition (LPCVD) method. Also, it is possible to use either an impurity-doped silicon film or an undoped silicon film as silicon film 26. First oxide film 24 and silicon film 26 are formed so as to dissipate stress caused when a field oxide is formed in a subsequent oxidation process and are formed to have a sufficient thickness for performing as an etch-blocking layer. Preferably, first oxide film 24 is formed to a thickness of 110~500Å and silicon film 26 is formed to a thickness of 500~2,000Å.

If silicon film 26 is exposed to the air, a native oxide (not shown) about 10~100Å thick forms on the surface of silicon film 26. In such a native oxide film, since the diffusion velocity of an oxidant (oxygen) is faster than that in a polysilicon or nitride silicon, the existence of the native oxide film becomes a factor increasing the size of the top bird's beak ("d" in FIG. 3). Therefore, the native oxide film which exists on silicon film 26 is nitrified using a reaction with Nhx gas, by performing a heat treatment process at a temperature of 850° C. in a nitride deposition chamber, so that the native oxide is converted into a silicon oxynitride (SiNO) film structure. In the silicon oxynitride film, the diffusion velocity of the oxidant is similar to that in the silicon nitride film. As mentioned above, the native oxide film is converted into the silicon oxynitride film, so that the diffusion velocity of the oxidant is decreased, thereby suppressing the generation of the top bird's beak.

Thereafter, a silicon nitride is deposited to a thickness of about 1,500Å on silicon film 26 by an LPCVD method, thereby forming oxidation-blocking film 28. Oxidation-blocking film 28 should be formed to a thickness which can minimize the bird's beak and can still dissipate stress in the layer, and preferably, should be formed to a thickness of 1,000~3,900Å. Then, an eight-hour heat treatment process is performed on the resultant structure on which oxidation-blocking film 28 is formed, at a high temperature of 1150° C. and in a nitrogen atmosphere. When the heat treatment process is performed as above, the interface between oxidation-blocking film 28 and silicon film 26 is stabilized, the grain size of silicon film 26 is increased, and the native oxide film is removed. As a result, a prior oxidation residue occurring along the grain boundary of silicon film 26 in a subsequent oxidation process is removed, so that the interface where silicon film 26 is oxidized becomes clear. The contact characteristics between silicon film 26 and oxidation-blocking layer 28 are therefore advantageously improved. Therefore, the generation of the top bird's beak (d) shown in FIG. 3 is suppressed.

On the other hand, for further activating a bonding reaction between silicon film 26 and oxidation-blocking film 28, nitrogen ions may be implanted on the entire surface of the resultant structure, after oxidation-blocking film 28 is formed. At this time, a peak dose of the nitrogen ions should exist in the interface between oxidation-blocking film 28 and silicon film 26.

Figure 5:
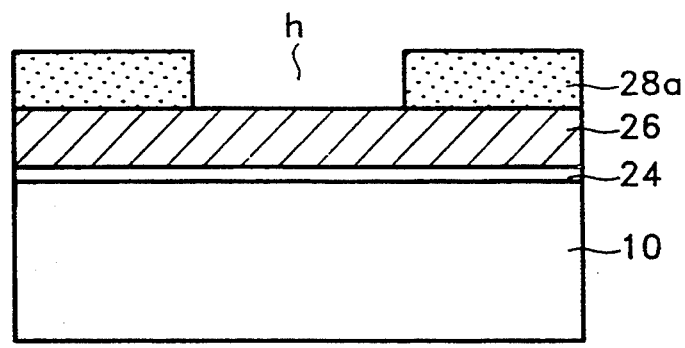

FIG. 5 shows a step of forming an opening (h). After coating a photoresist on oxidation-blocking film 28, the photoresist is exposed and developed, thereby forming a photoresist pattern (not shown) on the active region. Then, oxidation-blocking film 28 is etched by a reactive ion etching (RIE) method, using the photoresist pattern as an etch-mask, thereby forming opening (h). Opening (h) defines an isolation region and exposes a portion of silicon film 26. Then, the photoresist pattern is removed.

Figure 6:
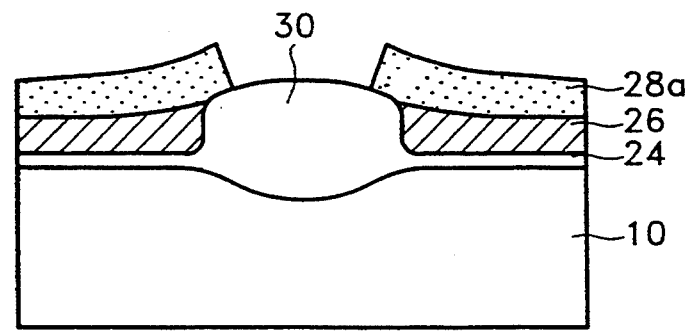

FIG. 6 shows a step of forming a field oxide film 30. By performing a thermal oxidation process on the resultant structure wherein the opening (h) is formed, the portion of silicon film 26 exposed by the opening and the surface of the semiconductor substrate of the opening portion are selectively oxidized. As a result, a field oxide film 30 about 4,000Å thick is formed.

Figure 7:
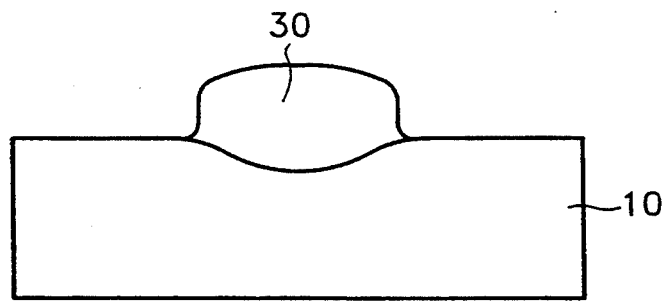

FIG. 7 shows a step of completing a process for forming the isolation region by removing oxidation-blocking layer 28 and silicon film 26.

According to the above-described isolation method of the present invention, as shown in FIG. 3, since the generation of the top bird's beak (d) between the oxidation-blocking film 28 and the silicon film 26 is suppressed, residual portions of the silicon film are not left when the process for forming the isolation region is completed (as it does in FIG. 2, for example). Therefore, stable isolation characteristics can be secured.

The ion-implantation for forming a channel-stop layer, which strengthens the electrical isolation between the elements, may be performed after the opening (h) of FIG. 5 is formed or after the field oxide film 30 shown in FIG. 6 is formed.

Figure 4:
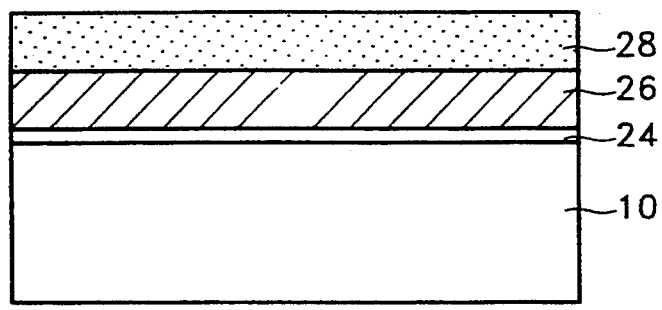
FIGS. 4 through 7 are cross-sectional views for illustrating an isolation method according to the present invention.

Also, the step of performing a high-temperature heat treatment in the nitrogen atmosphere as described in reference to FIG. 4 may be performed after the opening of FIG. 5 is formed.

FIGS. 8 through 14 are cross-sectional views for illustrating a method for manufacturing a CMOS according to the present invention.

Figure 8:
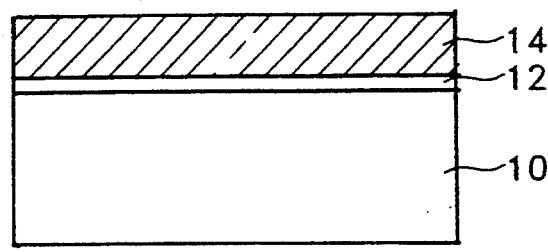
FIGS. 8 through 14 are cross-sectional views for illustrating a method for manufacturing a CMOS according to the present invention.

Referring to FIG. 8, after forming a pad oxide film 12 about 200Å thick on a semiconductor substrate 10 of a first conductivity type, (e.g., P-type), by a thermal oxidation process, a nitride film 14 of about 2,000Å thick is formed on pad oxide film 12 by an LPCVD method.

Figure 9:
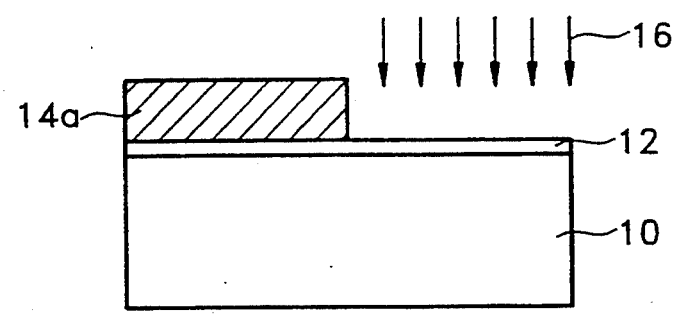

Referring to FIG. 9, after coating a photoresist (not shown) on nitride film 14, the photoresist is exposed and developed, thereby forming a photoresist pattern (not shown) for forming an N-well of a second conductivity type. Then, nitride film 14 is etched by an RIE method using the photoresist pattern as an etch-mask, thereby forming a nitride film pattern 14a. Next, N-type impurity ions 16 are implanted on the entire surface of the resultant structure on which nitride film pattern 14a is formed.

Figure 10:
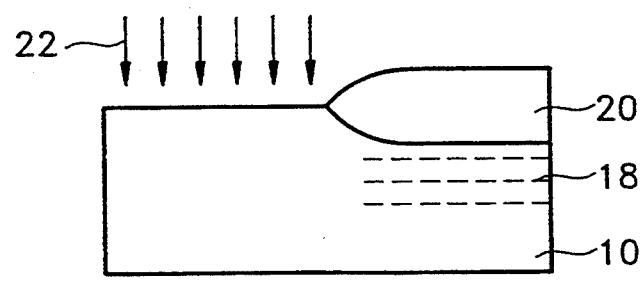

Referring to FIG. 10, the surface of semiconductor substrate 10 which is left exposed by nitride film pattern 14a is oxidized by a thermal oxidation process, thereby forming an oxide layer 20. Then, after removing nitride film pattern 14a, P-type impurity ions 22 are implanted on the entire surface of the semiconductor substrate 10 on which oxide layer 20 is formed.

Figure 11:
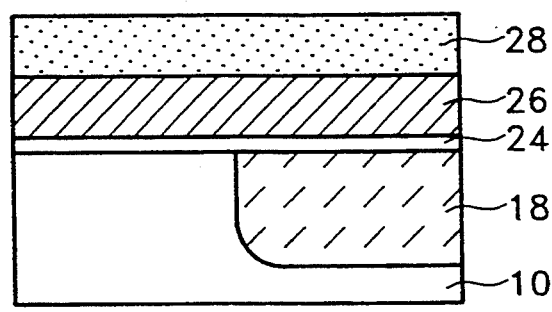

Referring to FIG. 11, a heat treatment process at a temperature of 1150° C. is performed for about eight hours on the entire surface of semiconductor substrate 10, thereby forming an N-well 18 and a P-well (not shown). Then, after removing oxide layer 20, a first oxide film 24 about 240Å thick is formed by a thermal oxidation process on semiconductor substrate 10 wherein N-well 18 and the P-well are formed. Thereafter, a silicon film 26 and an oxidation-blocking film 28 are formed on first oxide film 24 to a thickness of about 1,000Å and about 1,500Å, respectively, by an LPCVD method.

Figure 12:
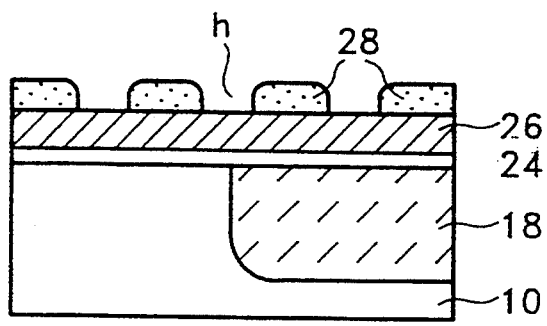

Referring to FIG. 12, on the resultant structure on which oxidation-blocking film 28 is formed, a heat treatment process is performed for about eight hours at a temperature of 1150° C. in a nitrogen atmosphere. Then, after coating a photoresist on oxidation-blocking film 28, the photoresist is exposed and developed, thereby forming a photoresist pattern (not shown) on the active region. Then, oxidation-blocking film 28 is etched by an RIE method using the photoresist pattern as an etch-mask, thereby forming an opening (h).

Figure 13:
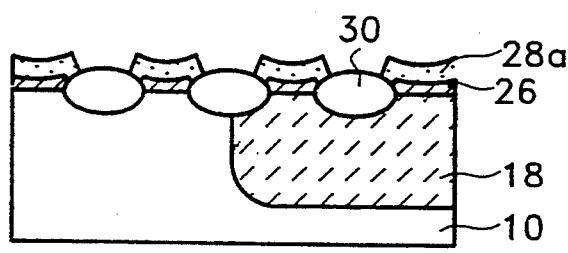

Referring to FIG. 13, a portion of silicon film 26 exposed by the opening (h) and the surface of the semiconductor substrate 10 at the opening portion are selectively oxidized by a thermal oxidation process, thereby forming a field oxide film 30.

Figure 14:
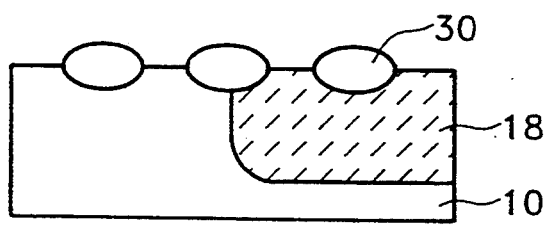

Referring to FIG. 14, oxidation-blocking film 28 and silicon film 26 are removed, thereby completing the process for forming an isolation region in a twin-well process.

According to the present invention as described above, the interface between the silicon film and the oxidation-blocking film is stabilized by a high-temperature heat treatment process which is performed after the oxidation-blocking film is formed. Also, according to the above high-temperature heat treatment process, the grain size of the silicon film is increased, so that the phenomenon of a prior oxidation occurring along the grain boundary during the field oxidation process is also suppressed. As a result, the interface where silicon film 26 is oxidized becomes clear.

Therefore, the top bird's beak between the oxidation-blocking film and the silicon film, which occurs in the conventional SEPOX method, is suppressed, so that the size of the isolation region can be reduced to a submicron level. Also, consistent isolation characteristics can be obtained.

It will be understood by those skilled in the art from the foregoing description of a preferred embodiment of the disclosed device that various changes and modifications may be made in the invention without departing from the spirit and scope thereof.

What is claimed is:

1. A method for forming an isolation region of a semiconductor device, comprising the steps of:
   (a) forming an oxide film on a semiconductor substrate;
   (b) forming a silicon layer on said oxide film;
   (c) forming an oxidation-blocking layer on said silicon layer;
   (d) heat treating said oxidation-blocking layer in a nitrogen-containing atmosphere;
   (e) selectively forming an opening in said heat-treated oxidation-blocking layer to expose a portion of said silicon layer;
   (f) thermally oxidizing said exposed portion of said silicon layer to thereby obtain a thermal oxide layer in said opening; and
   (g) removing said heat-treated oxidation-blocking layer.

2. An isolation method as claimed in claim 1, wherein said heat treatment step is performed after said step of forming an opening in said oxidation-blocking layer.

3. An isolation method as claimed in claim 1, wherein after said step of forming an oxidation-blocking layer said method further comprises the step of implanting nitrogen ions over a resultant structure having said oxidation-blocking layer formed thereon.

4. An isolation method according to claim 1, wherein said silicon layer is formed from an impurity-doped silicon.

5. An isolation method according to claim 1, wherein said oxidation-blocking layer is formed from silicon nitride.

6. An isolation method according to claim 1, wherein said step of heat treating said oxidation-blocking layer is carried out at at least about 1150° C. for about eight hours.

7. An isolation method according to claim 1, further comprising a step of nitrifying a resultant structure having said silicon layer formed thereon, before said step of forming said oxidation-blocking layer.

8. An isolation method according to claim 7, wherein said step of nitrifying comprises heating said resultant structure having said silicon layer formed thereon in a nitride deposition chamber to a temperature of about 850° C.

* * * * *